US012710378B2

(12) United States Patent
Wang

(10) Patent No.: US 12,710,378 B2
(45) Date of Patent: Aug. 18, 2026

(54) SYSTEM AND METHOD FOR WAFER SHAPE PAIRING FOR IMPROVED POST-BONDING PERFORMANCE

(71) Applicant: KLA Corporation, Milpitas, CA (US)

(72) Inventor: Xuewen Wang, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 119 days.

(21) Appl. No.: 18/797,715

(22) Filed: Aug. 8, 2024

(65) Prior Publication Data

US 2026/0043750 A1 Feb. 12, 2026

(51) Int. Cl.

*G01N 21/95* (2006.01)
*G01B 9/02* (2022.01)
*H10P 72/00* (2026.01)
*H10P 74/00* (2026.01)

(52) U.S. Cl.

CPC ..... *G01N 21/9501* (2013.01); *G01B 9/02034* (2013.01); *H10P 72/0611* (2026.01); *H10P 72/0616* (2026.01); *H10P 74/23* (2026.01)

(58) Field of Classification Search

CPC . G01N 21/95; G01B 9/02034; H10P 72/0611; H10P 72/0616; H10P 74/23

See application file for complete search history.

(56) References Cited

U.S. PATENT DOCUMENTS 6,847,458 B2 1/2005 Freischlad et al.
8,949,057 B1 2/2015 Seong et al.
9,121,684 B2 9/2015 Tang et al.
11,829,077 B2 11/2023 Zach et al.
2012/0077329 A1 3/2012 Broekaart et al.
2013/0011939 A1* 1/2013 Chan ....................... H10P 74/23 257/E21.529
2022/0013416 A1 1/2022 Ip
2022/0187718 A1 6/2022 Zach et al.
2023/0035201 A1* 2/2023 Zach ................... G05B 19/188

(Continued)

OTHER PUBLICATIONS

Ministry of Intellectual Property, International Search Report received in International Application No. PCT/US2025/041000, Nov. 30, 2025, 10 pages.

(Continued)

*Primary Examiner* — Tarifur R Chowdhury
*Assistant Examiner* — Carlos Perez-Guzman
(74) *Attorney, Agent, or Firm* — Suiter Swantz IP

(57) ABSTRACT

A system for wafer pairing for wafer-to-wafer bonding may include a wafer shape metrology sub-system and controller. The controller may receive the shape measurements for a set of top wafers and bottom wafers and then sort the set of top wafers and the bottom wafers into wafer groups based on the shape measurements. The controller may tag each top and bottom wafer with a wafer group number and determine wafer pairs from selected wafer groups. The controller may calculate the bow difference for each wafer pair of the set of wafer pairs and sort the set of wafer pairs into wafer pair groups based on intervals of bow difference. The controller may associate each wafer pair group with a corresponding reference recipe and direct a bonder to bond the wafer pairs in a selected wafer pair group according to a corresponding reference recipe associated with the selected wafer pair group.

27 Claims, 5 Drawing Sheets

(56) References Cited

U.S. PATENT DOCUMENTS

2023/0326814 A1 10/2023 Schepis et al.
2023/0335504 A1 10/2023 Sheng et al.

OTHER PUBLICATIONS

Chidambaram et al., "Wafer Level Fine-Pitch Hybrid Bonding: Challenges and Remedies," 2020 IEEE 22nd Electronics Packaging Technology Conference (EPTC), 2020, 5 pages.
Iacovo et al., "A Study of SiCN Wafer-to-Wafer Bonding and Impact of Wafer Warpage," 2023 IEEE 73rd Electronic Components and Technology Conference (ECTC), 2023, 8 pages.
Sitaraman et al., "A Holistic Development Framework for Hybrid Bonding," 2022 IEEE 72nd Electronic Components and Technology Conference (ECTC), 2022, 10 pages.

* cited by examiner

100

SYSTEM AND METHOD FOR WAFER SHAPE PAIRING FOR IMPROVED POST-BONDING PERFORMANCE

TECHNICAL FIELD

The present disclosure generally relates to wafer-to-wafer bonding, and, more particularly, to a system and method for wafer pairing to improve post-bonding performance.

BACKGROUND

As the demand for smaller and smaller semiconductor devices continues to grow, one methodology to improve feature density is the implementation of advanced packaging approaches such as heterogeneous integration. Heterogenous integration utilizes hybrid bonding and allows for high-density interconnection. However, high-density interconnection faces many challenges, such as larger wafer warpage, lower surface roughness, tighter on-product-overlay specifications, and the like. As wafer thicknesses decrease, uncontrolled warpage in wafers become more pronounced and cannot be neglected. Adjusting manufacture processes to reduce wafer warpage is difficult and comes with a high cost with a limited return. Previous approaches included measurement of warpage of incoming wafers and the direct bonding of the top and bottom wafers using a generic bonding recipe. These bonding recipes are not optimized for incoming wafer shapes. Thus, post-bonding performance, including reduction of overlay and defects, cannot be optimized. As a result, yield loss occurs and this loss will become amplified with the continuous increase of interconnect density. Therefore, it would be desirable to provide a system and method that cure the shortfalls of the previous approaches identified above to improve post-bonding performance.

SUMMARY

A system for wafer pairing for wafer-to-wafer bonding is disclosed, in accordance with one or more embodiments of the present disclosure. In some aspects, the system includes a wafer shape metrology sub-system configured to perform shape measurements on top wafers and bottom wafers; and a controller communicatively coupled to the wafer shape metrology sub-system, the controller including one or more processors configured to execute a set of program instructions stored in a memory. In some aspects, the set of program instructions are configured to cause the one or more processors to: receive the shape measurements for a set of top wafers from the wafer shape sub-system; receive shape measurements for a set of bottom wafers from the wafer shape sub-system; sort the set of top wafers and the bottom wafers into wafer groups based on the shape measurements for the set of top wafers and the shape measurements for the set of bottom wafers; tag each top wafer with a wafer group number and store in memory; tag each bottom wafer with a wafer group number and store in memory; determine wafer pairs from selected wafer groups to establish a set of wafer pairs and calculate the bow difference for each wafer pair of the set of wafer pairs; sort the set of wafer pairs into wafer pair groups based on intervals of bow difference; associate each wafer pair group with a corresponding reference recipe; and direct a bonder to bond the wafer pairs in a selected wafer pair group according to a corresponding reference recipe associated with the selected wafer pair group.

In some aspects, the system predicts at least one of post-bonding overlay or defects of one or more bonded wafer pairs.

In some aspects, the system measures at least one of post-bonding overlay or defects of one or more bonded wafer pairs with at least one an overlay metrology tool or a defect inspection tool.

In some aspects, the system compares the predicted post-bonding overlay or defects to measured post-bonding overlay or defects.

In some aspects, the system provides one or more feedback adjustments to one or more corresponding reference recipes based on a difference between the predicted post-bonding overlay or defects to measured post-bonding overlay or defects.

In some aspects, the system provides one or more feedback adjustments or feedforward adjustments to one or more process tools based on a difference between the predicted post-bonding overlay or defects to measured post-bonding overlay or defects.

In some aspects, the top wafer includes a 3D NAND wafer and the bottom wafer includes a logic wafer.

A system for wafer pairing for wafer-to-wafer bonding is disclosed, in accordance with one or more additional and/or alternative embodiments of the present disclosure. In some aspects, the system includes a wafer shape metrology sub-system configured to perform shape measurements on top wafers and bottom wafers; and a controller communicatively coupled to the wafer shape metrology sub-system. In some aspects, the controller includes one or more processors configured to execute a set of program instructions stored in a memory, the set of program instructions configured to cause the one or more processors to: receive the shape measurements for a set of top wafers from the wafer shape sub-system; receive shape measurements for a set of bottom wafers from the wafer shape sub-system; sort the set of top wafers and the bottom wafers into wafer groups based on the shape measurements for the set of top wafers and the shape measurements for the set of bottom wafers; tag each top wafer with a wafer group number and store in memory; tag each bottom wafer with a wafer group number and store in memory; determine top wafer pairs from selected top wafer groups to establish a set of top wafer pairs; sort the set of top wafer pairs into top wafer pair groups; associate each top wafer pair group with a corresponding reference recipe, wherein each top wafer pair group is associated with a bottom wafer pair group in a pre-established manner; and direct a bonder to bond the wafer pairs in a selected wafer pair group according to a corresponding reference recipe associated with the selected wafer pair group.

A method for wafer pairing for wafer-to-wafer bonding is disclosed, in accordance with one or more embodiments of the present disclosure. In some aspects, the method includes receiving shape measurements for a set of top wafers from the wafer shape sub-system; receiving shape measurements for a set of bottom wafers from the wafer shape sub-system; sorting the set of top wafers and the bottom wafers into wafer groups based on the shape measurements for the set of top wafers and the shape measurements for the set of bottom wafers; determining top wafer pairs from selected top wafer groups to establish a set of top wafer pairs; sorting the set of top wafer pairs into top wafer pair groups; associating each top wafer pair group with a corresponding reference recipe, wherein each top wafer pair group is associated with a bottom wafer pair group in a pre-established manner; and directing a bonder to bond the wafer pairs in a selected wafer pair group according to a corresponding reference recipe associated with the selected wafer pair group.

A method for wafer pairing for wafer-to-wafer bonding is disclosed, in accordance with one or more embodiments of the present disclosure. In some aspects, the method includes receiving the shape measurements for a set of top wafers from the wafer shape sub-system; receiving shape measurements for a set of bottom wafers from the wafer shape sub-system; sorting the set of top wafers and the bottom wafers into wafer groups based on the shape measurements for the set of top wafers and the shape measurements for the set of bottom wafers; determining top wafer pairs from selected top wafer groups to establish a set of top wafer pairs; sorting the set of top wafer pairs into top wafer pair groups; associating each top wafer pair group with a corresponding reference recipe, wherein each top wafer pair group is associated with a bottom wafer pair group in a pre-established manner; and directing a bonder to bond the wafer pairs in a selected wafer pair group according to a corresponding reference recipe associated with the selected wafer pair group.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1A-3, a system and method for wafer pairing for wafer-to-wafer bonding are illustrated, in accordance with one or more embodiments of the present disclosure.

Embodiments of the present disclosure are directed to improved wafer-to-wafer bonding through the identification of wafer pairs for bonding and the application of reference recipes tailored to the selected wafer pairs for improved bonding and a reduction of post-bonding overlay and defects. In the case of wafer-to-wafer bonding, wafer shape dramatically influences bonding performance. Typically, incoming wafer shapes are measured and then a generic recipe is applied to bond the wafers, resulting in less-than-optimal post-bonding performance. Embodiments of the present disclosure operate to group incoming wafers by one or more characteristics, such as, but not limited to, wafer shape. Once wafers are grouped, wafers within a group may be paired, whereby a difference in bow before and after bonding the wafer pair is calculated. In turn, the wafer pairs may be divided/binned into pre-determined intervals/bins according to the calculated bow difference. Each wafer pair group may then be assigned a corresponding reference recipe for application on a process tool (e.g., bonder). This wafer shape pairing solution of the present disclosure may reduce shape-induced overlay or defects and improve post-bonding performance. Additional embodiments of the present disclosure may provide feedback and/or feedforward adjustments to further improve the accuracy of corresponding reference recipes and give additional information for the next process step. In addition, embodiments of the present disclosure may take into account the wafer stack structure and/or surface topography to build more robust reference recipes.

Figure 1A:
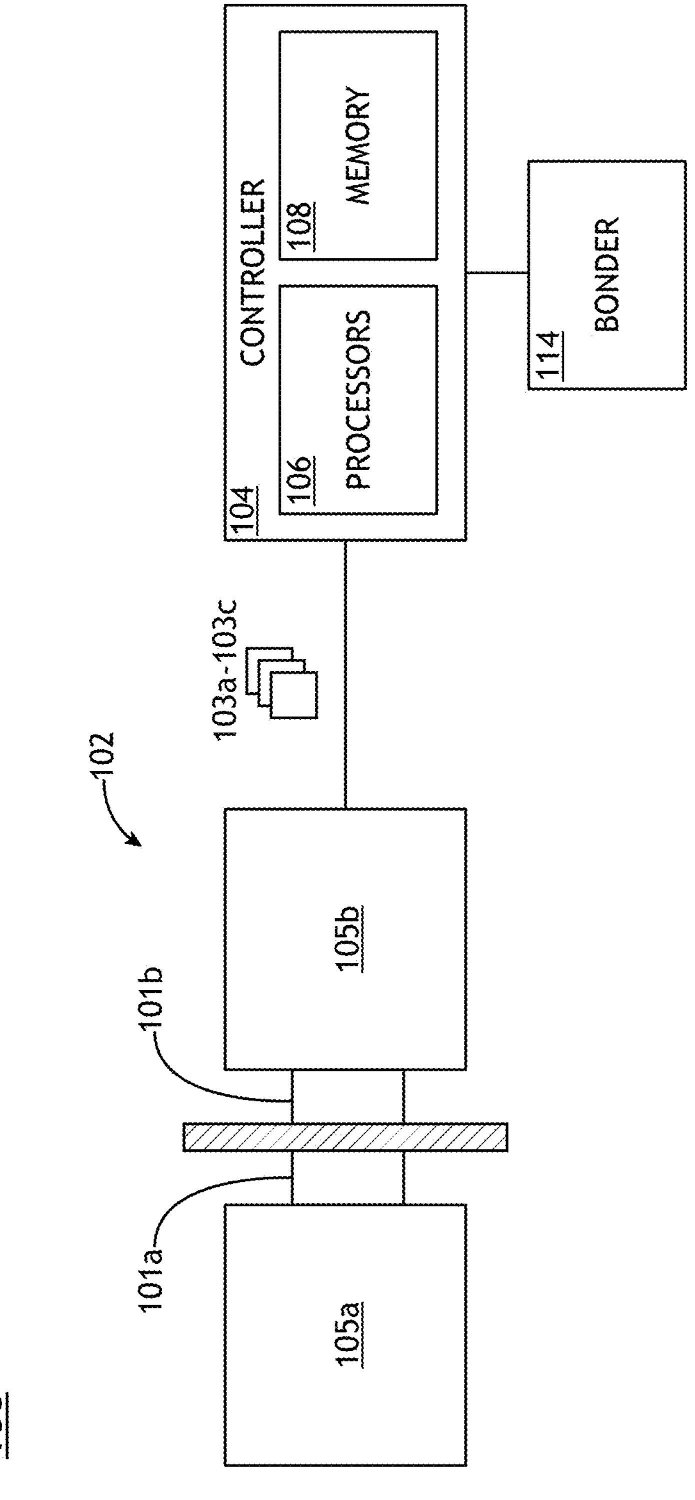
FIG. 1A illustrates a simplified block diagram of a wafer shape metrology system for wafer pairing for wafer-to-wafer bonding, in accordance with one or more embodiments of the present disclosure.

FIG. 1A illustrates a simplified block diagram of a wafer shape metrology system 100 for post-bonding overlay metrology, in accordance with one or more embodiments of the present disclosure. In embodiments, system 100 includes a wafer shape metrology sub-system 102. The system 100 may also include a controller 104 communicatively coupled to a detector output of the wafer shape metrology sub-system 102. The controller 104 may include one or more processors 106 and memory 108. The one or more processors 106 of the controller 104 may be configured to execute a set of program instructions stored in memory 108. The set of program instructions may be configured to cause the one or more processors 106 to carry out various steps and processes of the present disclosure.

The wafer shape metrology sub-system 102 may include any wafer geometry tool or system known in the art capable of acquiring one or more shape parameters from one or more wafers. In embodiments, the wafer shape metrology sub-system 102 includes an interferometer sub-system configured to perform one or more metrology and/or characterization processes on one or more wafers. For example, the wafer shape metrology sub-system 102 may include a dual interferometer system (e.g., dual Fizeau interferometer) configured to perform measurements on opposite sides of a wafer. For instance, wafer shape metrology sub-system 102 may include a first interferometer sub-system 105*a* configured to generate a first illumination beam 101*a* in order to perform one or more measurements on a first surface of the wafer, and a second interferometer sub-system 105*b* configured to generate a second illumination beam 101*b* in order to perform one or more measurements on a second surface of the wafer opposite the first surface. The wafer metrology sub-system 102 may include a Patterned Wafer Geometry (PWG) tool such as the PWG tool produced by KLA INC. The use of interferometry for wafer characterization is generally described in U.S. Pat. No. 6,847,458, filed on Mar. 20, 2003; U.S. Pat. No. 8,949,057, filed on Oct. 27, 2011; and U.S. Pat. No. 9,121,684. filed on Jan. 15, 2013, which are incorporated herein by reference in their entirety. The use of PWG tools to predict post-bonded performance is discussed in U.S. Pat. No. 11,829,077 B2, granted on Nov. 28, 2023, which is incorporated herein by reference in the entirety.

It is noted that dual-sided interferometry, such as a PWG tool, may be of particular usefulness for implementation in the context of the processes of the present disclosure. For example, thickness and/or thickness changed information can be an input into the machine learning algorithm and/or the mechanical model of the present disclosure. Additionally, dual-sided measurements provide flexibility in the event one surface has attributes that makes measurement unreliable. In addition, dual-sided measurements allow for the averaging of shape information from two measurements, improving reliability.

It is noted herein that the scope of the present disclosure is not limited to a dual interferometer system of a PWG implementation and may be extended to encompass any wafer metrology system or tool known in the art including, but not limited to, single-sided interferometer systems.

In embodiments, the wafer shape metrology sub-system 102 is configured to perform wafer shape measurements on wafers while in a stress-free or near stress-free state. For the purposes of the present disclosure, the term “stress free” should be interpreted to mean a configuration with little force applied to the wafer from external sources. The term “stress free” may alternatively be interpreted as “free standing.” With external stresses removed, remnant deviations from a flat wafer shape are typically induced through stressed layers present on the frontside of the wafer or due to stresses imposed by the bonding process. It is noted that these stresses caused by layers present on the wafers are interpreted as internal stresses. In this sense, ‘shape’ of a wafer is a combination of ‘natural shape’ (i.e., bare wafer shape) and the shape caused by internal stresses on either surface of the wafer such as thin-films.

Figure 1B:
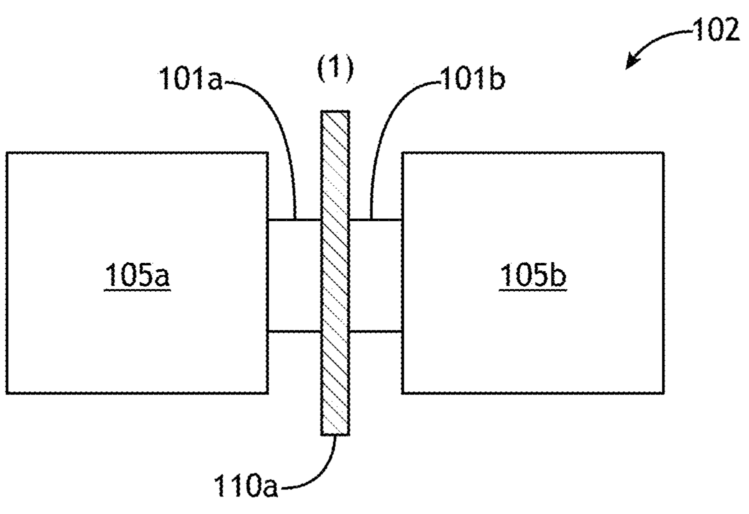
FIG. 1B illustrates a conceptual view of the wafer shape metrology system performing wafer shape measures on a first wafer, a second wafer, and a post-bonded pair of wafers, in accordance with one or more embodiments of the present disclosure.
Figure 1B:
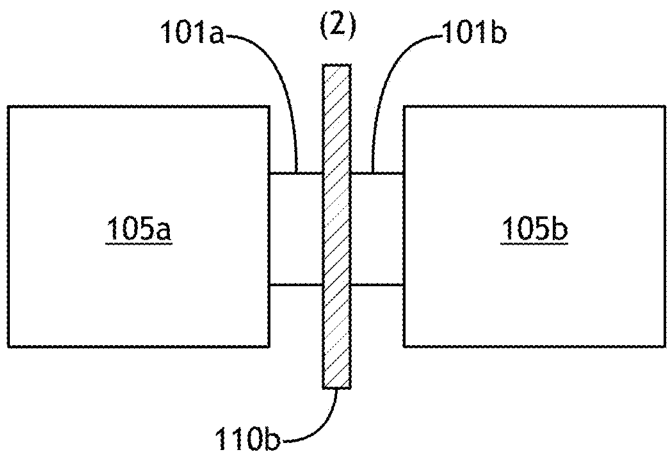
Figure 1B:
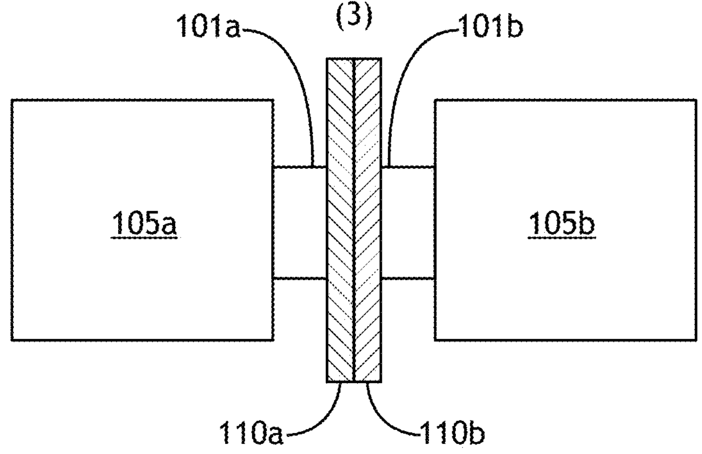

In embodiments, as shown in FIG. 1B, the wafer metrology sub-system 102 may perform (1) shape measurements on a first wafer; (2) shape measurements on a second wafer; and (3) shape measurements on the post-bonding pair of wafers. Additionally, it is noted that, in some embodiments, measurements on the pre-bonded first and second wafers may be used to predict shape of the post-bonded pair of wafers based on mismatch of the shapes of the first and second wafers and the effect of the bonder and bonding process on the post-bonded pair.

In embodiments, the wafer metrology sub-system 102 may perform a first shape measurement on a first wafer 110*a* and then transmit the shape measurement data to the controller 104 via data signal 103*a*. The wafer metrology sub-system 102 may perform a second shape measurement on a second wafer 110*b* and then transmit the shape measurement data to the controller 104 via data signal 103*b*. Then, the first wafer 110*a* and the second wafer 110*b* may undergo a bonding process via a bonder 114 to form a post-bonding wafer pair 110*c*. The wafer metrology sub-system 102 may perform a third shape measurement on the post-bonding wafer pair 110*c* and then transmit the shape measurement data to the controller 104 via data signal 103*c*.

In embodiments, the first wafer 110*a* and the second wafer 110*b* correspond to a top wafer and bottom wafer respectively for bonding in a wafer stack.

In embodiments, controller 104 is configured to receive the shape measurements for a set of top wafers from the wafer shape sub-system 102. In embodiments, the controller 104 is configured to receive shape measurements for a set of bottom wafers from the wafer shape sub-system 102. In embodiments, controller 104 is configured to sort the set of top wafers and the bottom wafers into wafer groups based on the shape measurements for the set of top wafers and the shape measurements for the set of bottom wafers.

In embodiments, controller 104 is configured to tag each first wafer with a wafer group number and store the association in memory 108. In embodiments, the controller 104 is also configured to tag each second wafer with a wafer group number and store in memory.

In embodiments, controller 104 is configured to determine wafer pairs from selected wafer groups to establish a set of wafer pairs. For example, if the wafers were grouped into Group1, Group2, Group3, Group 4, and so on, the controller 104 may select a group and determine pairs of wafers in a common group to establish a set of wafer pairs. The controller 104 may then calculate the bow difference (Δbow) for each wafer pair of the set of wafer pairs. In embodiments, the controller 104 is configured to sort the set of wafer pairs into wafer pair groups based on intervals of Δbow. It is noted that ideally the post-bonding wafer pair bow is minimized. The quantity Δbow is provided as follows:

$$\Delta\text{bow}=\text{Incoming Top Wafer Bow}+\text{Incoming Bot Wafer Bow}-2(\text{Post-Bonding Wafer Pair Bow})$$

In embodiments, controller 104 is configured to associate each wafer pair group with a corresponding reference recipe. In embodiments, controller 104 is configured to direct a bonder 114 to bond the wafer pairs in a selected wafer pair group (e.g., largest group) according to a corresponding reference recipe associated with the selected wafer pair group.

In embodiments, a metrology and/or inspection tool may be implemented to measure the actual performance of the bonding process. The actual results of bonding a given wafer pair or multiple wafer pairs of a wafer group may be compared to the post-bonding predictions which drive the selection of a particular corresponding reference recipe. Post-bonding predictions may be performed in any manner known in the art. For example, post-bonding predictions may be performed utilizing the methodology described in U.S. Pat. No. 11,829,077 B2, granted on Nov. 28, 2023, which is incorporated previously herein by reference.

In embodiments, when the actual results from the metrology and/or inspection tool indicate inadequate bonding results, the controller 104 may then provide a feedback adjustment to the one or more corresponding reference recipe(s). In this sense, the corresponding reference recipe(s) may be adjusted to better optimize bonding performance (i.e., reduce post-bonding overlay and defects to an acceptable level).

Figure 1C:
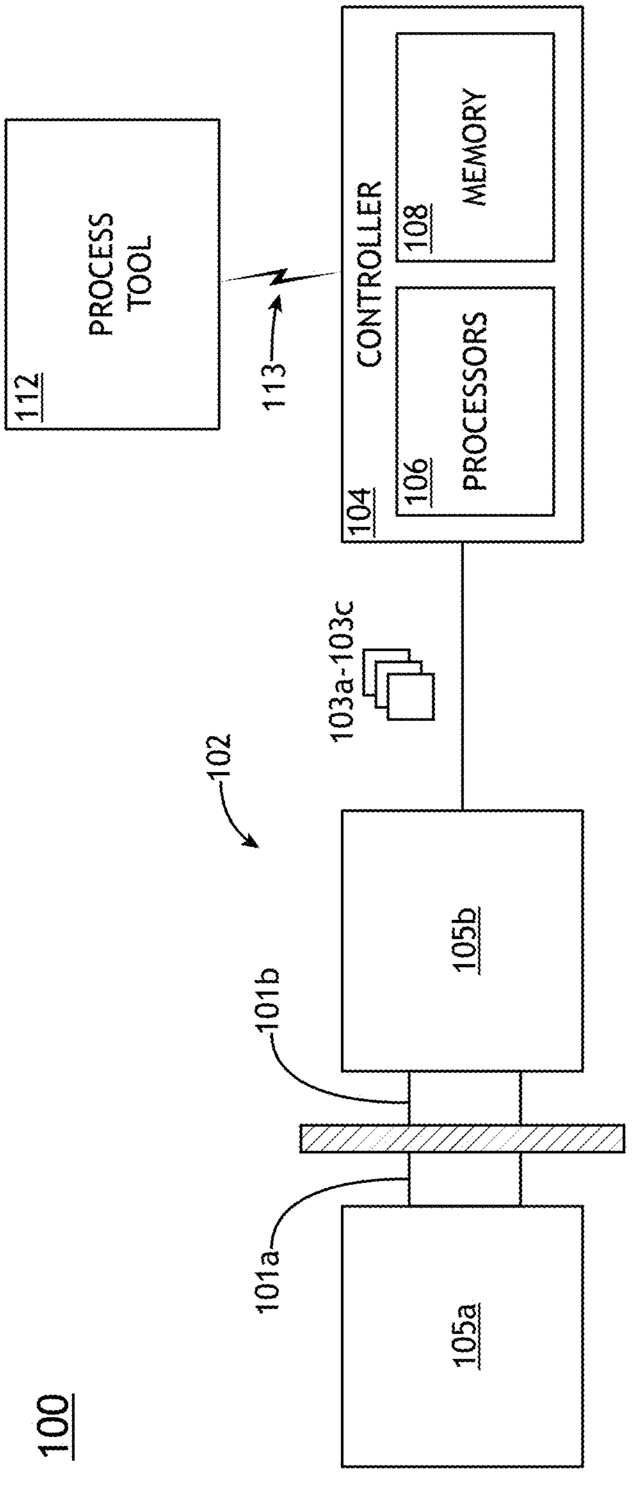
FIG. 1C illustrates a simplified block diagram of the wafer shape metrology system depicting feedback and/or feedforward control of process tool, in accordance with one or more embodiments of the present disclosure.

In additional step, when the actual results from the metrology and/or inspection tool indicate inadequate bonding results, the controller 104 may then provide a feedback and/or a feedforward adjustment to one or more process tools (e.g., lithography tool, polisher, bonder, and the like) to mitigate the inadequate bonding results. For example, as shown in FIG. 1C, one or more control signals 113 may be transmitted to one or more process tools 112 to adjust one or more states of the one or more process tools 112 to mitigate overlay between the first wafer 110*a* and second wafer 110*b*. For example, controller 104 may generate one or more feedback control signals configured to adjust one or more upstream process tools. By way of another example, the controller 104 may generate one or more feedforward control signals configured to adjust one or more downstream process tools. Process tools which may be adjusted may include, but are not limited to, a lithography tool, a deposition tool, a polishing tool, an etching tool, a bonder, and the like.

It is noted that two different group numbers exist in the procedure outlined above. The first number is the wafer group number which may be tagged just after wafer shape measurements are performed, the second number is a pair group number which may be calculated by controller 104. In embodiments, the wafer groups can be determined by wafer shape or stress. Wafers with similar shapes or stress distribution may be categorized into the same wafer group, thereby creating a set of wafer groups. The similarity threshold for distinguishing between different wafer groups may be based on experimental data or simulation. It is noted that the criterion of wafer groups for top and bottom wafers may be different. Top wafers may have different stress condition than bottom wafers. For example, in the case of 3D NAND wafer stacking on a logic wafer, generally, 3D NAND wafers experience much higher stress, and the shapes deviate significantly from a flat state. In contrast, logic wafers experience lower stress and are almost flat. In embodiments, wafer pair groups can be divided, or binned, by intervals of Δbow, and the interval can be determined through experimental information (e.g., DOE results or experience) or simulation (e.g., physical simulation, machine learning, and the like). Further, each wafer pair group has its own corresponding reference recipe. The corresponding reference recipe is optimized for the particular wafer pair group. The relationship between wafer paired groups and optimized reference recipes is determined by experiments and/or simulation. The reference recipe may be used for adjusting process tool parameters. For example, the reference recipes for the wafer pair groups may be used to adjust bonder tool parameters, such as bonding strength, temperature, time of duration, alignment model, and the like.

Wafers may be paired based on a variety of restrictions. In embodiments, the restrictions may include time constraints and wafer groups. For example, the top and bottom wafers may be paired in a set period and with wafer group matchup.

Corresponding wafer groups may be defined through experiments or simulation. In embodiments, controller 104 may sort selected top and bottom wafers separately and find the most matched pairs overall. The matching rate can be defined as wafer stress distribution difference between top and bottom wafers or other parameters that influence post-bonding performance. Then, the controller 104 may calculate Δbow of all pairs in the set period and divide the pairs into pair groups (e.g., pair_group_001, pair_group_002, and so on).

In embodiments, to improve bonding stability, the controller 104 may sort the pair groups by number of paired wafers and select the pair group with the most members. The selected pair group information may be used to direct the bonder which reference recipe should be applied. Following this round, information from new wafers may be sent to a database in memory 108, and a new pair group may be selected and the process repeated. To simplify, the controller 104 may sort the pair groups from large to small and find the corresponding recipes one by one. Then, the controller 104 may apply the recipes on the tool sequentially until all wafers collected from a given round are bonded.

In addition, the controller 104, using Δbow, wafer stack information, history data, or other information, the controller 104 may predict post-bonding performance, including voids and overlay, and check if the paired wafers are within process limits after bonding. If the prediction matches physical truth accurately, the prediction model is deemed reliable. If not adequately accurate, controller 104 should utilize real data to feedback to the model to improve the reference recipe.

In alternative and/or additional embodiments, the pairing method may top and bottom wafers may be assigned a pre-determine correspondence. In this way, once a top wafer/wafer group is chosen then the corresponding bottom wafer/wafer group is assigned to the chosen top wafer/wafer group based on the pre-determined assignment. In embodiments, the controller 104 determines top wafer pairs from selected top wafer groups to establish a set of top wafer pairs and then sorts the set of top wafer pairs into top wafer pair groups. In turn, controller 104 may associate each top wafer pair group with a corresponding reference recipe, wherein each top wafer pair group is associated with a bottom wafer pair group in a pre-established manner. The controller 104 may then direct a bonder to bond the wafer pairs in a selected wafer pair group according to a corresponding reference recipe associated with the selected wafer pair group.

The one or more processors 106 of controller 104 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 106 may include any device configured to execute algorithms and/or instructions (e.g., program instructions stored in memory). In one embodiment, the one or more processors 106 may be embodied as a desktop computer, mainframe computer system, workstation, image computer, parallel processor, networked computer, or any other computer system configured to execute a program configured to operate or operate in conjunction with the metrology system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 104 may include one or more controllers housed in a common housing or within multiple housings. In this way, any controller or combination of controllers may be separately packaged as a module suitable for integration into metrology system 100. Further, the controller 104 may analyze data received from the wafer metrology sub-system 102 and feed the data to additional components within the metrology system 100 or external to the metrology system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like).

It is noted herein that the one or more components of the disclosed system 100 may be communicatively coupled to the various other components of the system in any manner known in the art. For example, the wafer metrology sub-system 102, controller 104, the process tool 112, and a user interface may be communicatively coupled to each other and other components via a wireline (e.g., copper wire, fiber optic cable, and the like) or wireless connection (e.g., RF coupling, IR coupling, data network communication (e.g., WiFi, WiMax, 3G, 4G, 4G LTE, 5G, Bluetooth, and the like).

Figure 2:
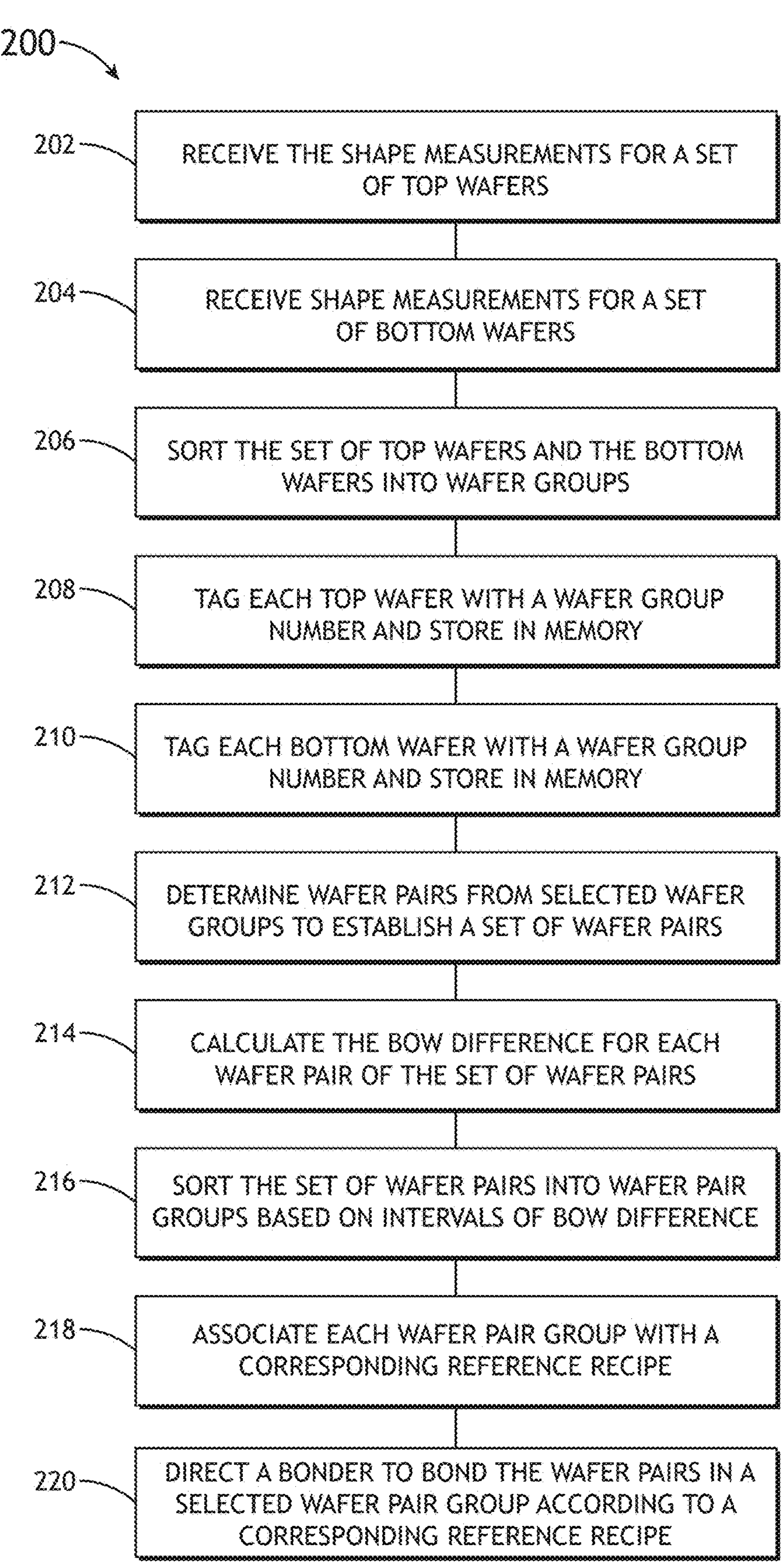
FIG. 2 illustrates a process flow diagram depicting a method of wafer pairing for wafer-to-wafer bonding, in accordance with one or more embodiments of the present disclosure.

FIG. 2 illustrates a method of wafer pairing for wafer-to-wafer bonding, in accordance with one or more embodiments of the present disclosure. It is noted herein that the steps of method 200 may be implemented all or in part by wafer metrology system 100. It is further recognized, however, that method 200 is not limited to the wafer metrology system 100 in that additional or alternative system-level embodiments may carry out all or part of the steps of method 200. For the purposes of this example the first wafer 110*a* and the second wafer 110*b* may be a top wafer and bottom wafer to be bonded into a wafer stack.

In step 202, wafer shape measurements for a set of top wafers are received. For example, as shown in FIG. 1A, the wafer shape sub-system 102 may perform a wafer shape measurement on top wafers 110*a* prior to a wafer bonding process. In turn, the wafer shape measurement data for the top wafers 110*a* may be received by controller 104. In step 204, wafer shape measurements for a set of bottom wafers are received. For example, as shown in FIG. 1A, the wafer shape sub-system 102 may perform a wafer shape measurement on bottom wafers 110*a* prior to a wafer bonding process. In turn, the wafer shape measurement data for the bottom wafers 110*a* may be received by controller 104.

In step 206, the top wafers and bottom wafers are sorted into a wafer groups. For example, controller 104 may sort the top wafers and bottom wafers into different groups based on the similarity of one or more characteristics of the wafers. For instance, controller 104 may sort wafers having similar wafer shape characteristics into the same groups. For example, controller 104 may apply a PWG grouping algorithm to quantify the similarity of wafer shapes during grouping.

In step 208, each top wafer is tagged with a wafer group number and stored in memory. For example, controller 104 may tag, or associate, each top wafer with a number, or other identifier, that corresponds with the wafer group the given top wafer is grouped into. In step 210, each bottom wafer is tagged with a wafer group number and stored in memory. For example, controller 104 may tag, or associate, each bottom wafer with a number, or other identifier, that corresponds with the wafer group the given top wafer is grouped into.

In step 212, wafer pairs from selected wafer groups are determined to establish a set of wafer pairs. For example, controller 104 may determine wafer pairs form selected wafer groups to establish a set of wafer pairs. For example, for wafers grouped into Group1, Group2, Group3, Group 4, and so on, the controller 104 may select a group and determine pairs of wafers in a common group to establish a set of wafer pairs.

In step 214, the bow difference, Δbow, for each wafer pair found in step 212 is calculated. For example, the controller 104 may calculate Δbow for each wafer pair of the set of wafer pairs.

In step 216, the set of wafers pairs are sorted into wafer pair groups based on intervals of bow difference. For example, the controller 104 may sort the set of wafer pairs into wafer pair groups based on intervals/bins of Δbow. The interval/bins for dividing the wafer pairs may be determined using experimental information, such as DOE results, or through simulation results, such as physical simulation or machine learning.

In step 218, each wafer pair group found in step 216 may be associated with a corresponding reference recipe. For example, controller 104 may associate each wafer pair group with a corresponding reference recipe. Each corresponding reference recipe may be optimized, or tailored, for the particular wafer pair group. The relationship between wafer pair groups and corresponding reference recipes is determined by experimental data and/or simulation. The reference recipe may be used for adjusting process tool parameters prior to and/or during bonding the top and bottom wafers of a given wafer pair.

In step 220, a bonder is directed to bond the wafer pairs in a selected wafer pair group according to a corresponding reference recipe. For example, the reference recipes for the wafer pair groups may be used to adjust bonder tool parameters, such as bonding strength, temperature, time of duration, alignment model, and the like.

In an additional step, a metrology and/or inspection tool may be implemented to measure the actual performance of the bonding process. The actual results of bonding a given wafer pair or multiple wafer pairs of a wafer group may be compared to the post-bonding predictions which drive the selection of a particular corresponding reference recipe.

In an additional step, when the actual results from the metrology and/or inspection tool indicate inadequate bonding results, the controller 104 may then provide a feedback adjustment to the one or more corresponding reference recipe(s). In this sense, the corresponding reference recipe(s) may be adjusted to better optimize bonding performance (i.e., reduce post-bonding overlay and defects to an acceptable level).

In additional step, when the actual results from the metrology and/or inspection tool indicate inadequate bonding results, the controller 104 may then provide a feedback and/or a feedforward adjustment to one or more process tools (e.g., lithography tool, polisher, bonder, and the like) to mitigate the inadequate bonding results. For example, as shown in FIG. 1C, one or more control signals 113 may be transmitted to one or more process tools 112 to adjust one or more states of the one or more process tools 112 to mitigate overlay between the first wafer 110*a* and second wafer 110*b*. For example, the controller 104 may generate one or more feedback control signals configured to adjust one or more upstream process tools. By way of another example, the controller 104 may generate one or more feedforward control signals configured to adjust one or more downstream process tools. Process tools which may be adjusted may include, but are not limited to, a lithography tool, a deposition tool, a polishing tool, an etching tool, a bonder, and the like.

Figure 3:
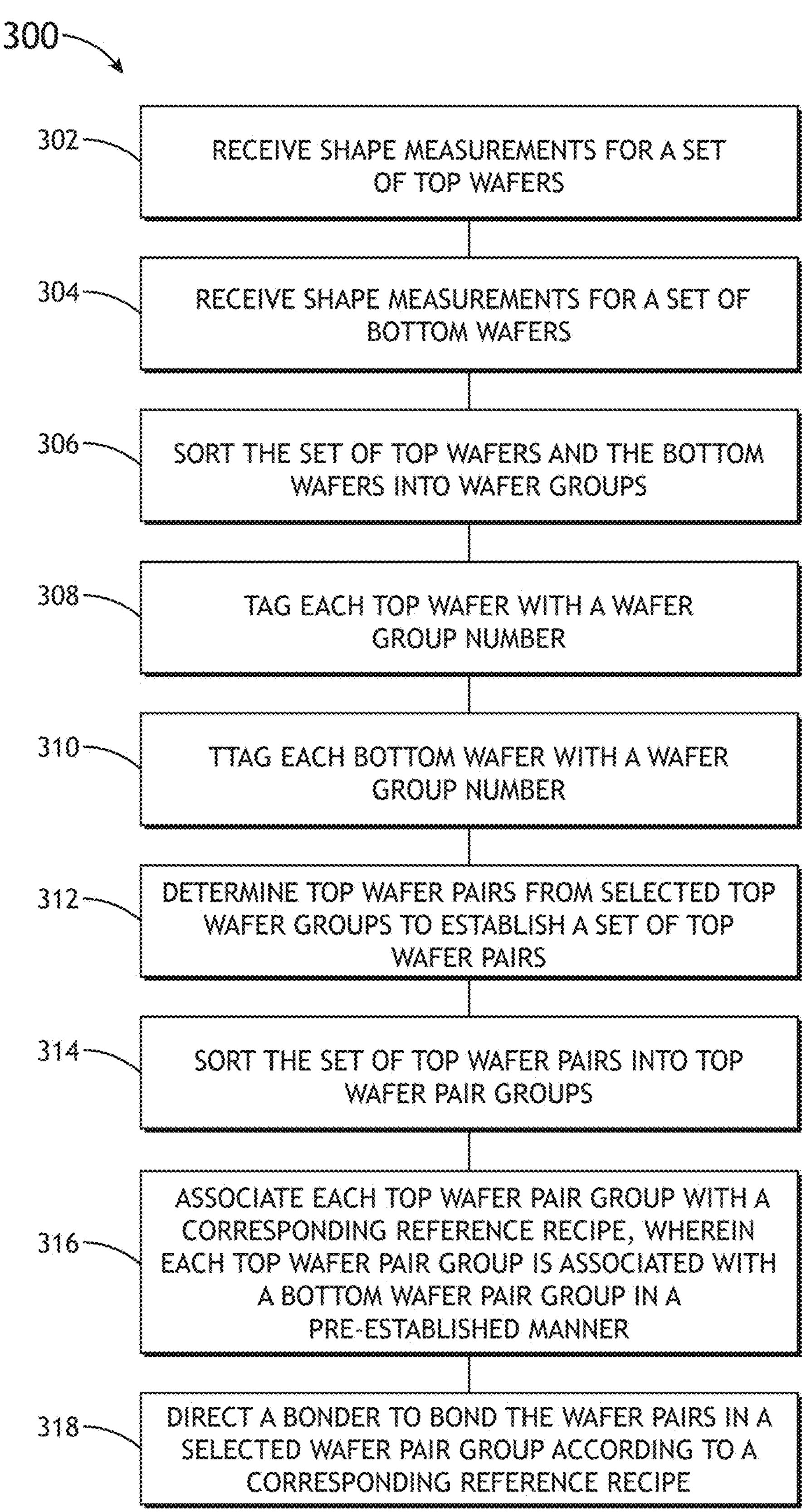
FIG. 3 illustrates a process flow diagram depicting a method of wafer pairing for wafer-to-wafer bonding, in accordance with one or more additional and/or alternative embodiments of the present disclosure.

FIG. 3 illustrates a method of wafer pairing for wafer-to-wafer bonding, in accordance with one or more additional and/or alternative embodiments of the present disclosure. It is noted herein that the steps of method 300 may be implemented all or in part by wafer metrology system 100. It is further recognized, however, that the method 300 is not limited to the wafer metrology system 100 in that additional or alternative system-level embodiments may carry out all or part of the steps of method 300.

In step 302, the shape measurements for a set of top wafers from the wafer shape sub-system are received (e.g., by controller 104).

In step 304, the shape measurements for a set of bottom wafers from the wafer shape sub-system are received (e.g., by controller 104).

In step 306, the set of top wafers and the bottom wafers are sorted into wafer groups based on the shape measurements for the set of top wafers and the shape measurements for the set of bottom wafers.

In step 308, each top wafer is tagged with a wafer group number and store in memory. In step 310, each bottom wafer is tagged with a wafer group number and store in memory.

In step 310, top wafer pairs are determined from selected top wafer groups to establish a set of top wafer pairs.

In step 312, the set of top wafer pairs are sorted into top wafer pair groups.

In step 314, each top wafer pair group is associated with a corresponding reference recipe, wherein each top wafer pair group is associated with a bottom wafer pair group in a pre-established manner.

In step 316, a bonder is directed to bond the wafer pairs in a selected wafer pair group according to a corresponding reference recipe associated with the selected wafer pair group.

One skilled in the art will recognize that the herein described components, operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A wafer shape metrology system comprising:

a wafer shape metrology sub-system configured to perform shape measurements on top wafers and bottom wafers; and a controller communicatively coupled to the wafer shape metrology sub-system, the controller including one or more processors configured to execute a set of program instructions stored in a memory, the set of program instructions configured to cause the one or more processors to:

receive shape measurements for a set of top wafers from the wafer shape sub-system;

receive shape measurements for a set of bottom wafers from the wafer shape sub-system;

sort the set of top wafers and the bottom wafers into wafer groups based on the shape measurements for the set of top wafers and the shape measurements for the set of bottom wafers;

tag each top wafer with a wafer group number and store in memory;

tag each bottom wafer with a wafer group number and store in memory;

determine wafer pairs from selected wafer groups to establish a set of wafer pairs and calculate a bow difference for each wafer pair of the set of wafer pairs;

sort the set of wafer pairs into wafer pair groups based on intervals of the bow difference;

associate each wafer pair group with a corresponding reference recipe; and direct a bonder to bond the wafer pairs in a selected wafer pair group according to a corresponding reference recipe associated with the selected wafer pair group.

2. The system of claim 1, wherein the selected wafer pair group comprises a largest wafer pair group.

3. The system of claim 1, further comprising:

predict at least one of post-bonding overlay or defects of one or more bonded wafer pairs.

4. The system of claim 1, further comprising:

measure at least one of post-bonding overlay or defects of one or more bonded wafer pairs with at least one an overlay metrology tool or a defect inspection tool.

5. The system of claim 4, further comprising:

compare the predicted post-bonding overlay or defects to measured post-bonding overlay or defects.

6. The system of claim 5, further comprising:

provide one or more feedback adjustments to one or more corresponding reference recipes based on a difference between the predicted post-bonding overlay or defects to measured post-bonding overlay or defects.

7. The system of claim 5, further comprising:

provide one or more feedback adjustments or feedforward adjustments to one or more process tools based on a difference between the predicted post-bonding overlay or defects to measured post-bonding overlay or defects.

8. The system of claim 1, wherein the set of program instructions are configured to cause the one or more processors to:

following sorting the set of top wafers and the bottom wafers into the wafer groups, tag each top wafer with a wafer group number and store in memory.

9. The system of claim 1, wherein the set of program instructions are configured to cause the one or more processors to:

following sorting the set of top wafers and the bottom wafers into the wafer groups, tag each bottom wafer with a wafer group number and store in memory.

10. The system of claim 1, wherein the wafer shape metrology sub-system is configured to perform stress-free shape measurements on top wafers and bottom wafers.

11. The system of claim 1, wherein the top wafer comprises a 3D NAND wafer.

12. The system of claim 1, wherein the bottom wafer comprises a logic wafer.

13. A wafer shape metrology system comprising:

a wafer shape metrology sub-system configured to perform shape measurements on top wafers and bottom wafers; and a controller communicatively coupled to the wafer shape metrology sub-system, the controller including one or more processors configured to execute a set of program instructions stored in a memory, the set of program instructions configured to cause the one or more processors to:

receive the shape measurements for a set of top wafers from the wafer shape sub-system;

receive shape measurements for a set of bottom wafers from the wafer shape sub-system;

sort the set of top wafers and the bottom wafers into wafer groups based on the shape measurements for the set of top wafers and the shape measurements for the set of bottom wafers;

tag each top wafer with a wafer group number and store in memory;

tag each bottom wafer with a wafer group number and store in memory;

determine top wafer pairs from selected top wafer groups to establish a set of top wafer pairs;

sort the set of top wafer pairs into top wafer pair groups;

associate each top wafer pair group with a corresponding reference recipe, wherein each top wafer pair group is associated with a bottom wafer pair group in a pre-established manner; and direct a bonder to bond the wafer pairs in a selected wafer pair group according to a corresponding reference recipe associated with the selected wafer pair group.

14. The system of claim 13, further comprising:

predict at least one of post-bonding overlay or defects of one or more bonded wafer pairs.

15. The system of claim 14, further comprising:

measure at least one of post-bonding overlay or defects of one or more bonded wafer pairs with at least one an overlay metrology tool or a defect inspection tool.

16. The system of claim 15, further comprising:

compare the predicted post-bonding overlay or defects to measured post-bonding overlay or defects.

17. The system of claim 16, further comprising:

provide one or more feedback adjustments to one or more corresponding reference recipes based on a difference between the predicted post-bonding overlay or defects to measured post-bonding overlay or defects.

18. The system of claim 16, further comprising:

provide one or more feedback adjustments or feedforward adjustments to one or more process tools based on a difference between the predicted post-bonding overlay or defects to measured post-bonding overlay or defects.

19. The system of claim 13, wherein the set of program instructions are configured to cause the one or more processors to:

following sorting the set of top wafers and the bottom wafers into the wafer groups, tag each top wafer with a wafer group number and store in memory.

20. The system of claim 13, wherein the set of program instructions are configured to cause the one or more processors to:

following sorting the set of top wafers and the bottom wafers into the wafer groups, tag each bottom wafer with a wafer group number and store in memory.

21. The system of claim 13, wherein the wafer shape metrology sub-system is configured to perform stress-free shape measurements on top wafers and bottom wafers.

22. The system of claim 13, wherein the top wafer comprises a 3D NAND wafer.

23. The system of claim 13, wherein the bottom wafer comprises a logic wafer.

24. A system comprising:

a controller, the controller including one or more processors configured to execute a set of program instructions stored in a memory, the set of program instructions configured to cause the one or more processors to:

receive shape measurements for a set of top wafers from a wafer shape sub-system;

receive shape measurements for a set of bottom wafers from the wafer shape sub-system;

sort the set of top wafers and the bottom wafers into wafer groups based on the shape measurements for the set of top wafers and the shape measurements for the set of bottom wafers;

determine wafer pairs from selected wafer groups to establish a set of wafer pairs and calculate a bow difference for each wafer pair of the set of wafer pairs;

sort the set of wafer pairs into wafer pair groups based on intervals of the bow difference;

associate each wafer pair group with a corresponding reference recipe; and direct a bonder to bond the wafer pairs in a selected wafer pair group according to a corresponding reference recipe associated with the selected wafer pair group.

25. A system comprising:

a controller, the controller including one or more processors configured to execute a set of program instructions stored in a memory, the set of program instructions configured to cause the one or more processors to:

receive shape measurements for a set of top wafers from a wafer shape sub-system;

receive shape measurements for a set of bottom wafers from the wafer shape sub-system;

sort the set of top wafers and the bottom wafers into wafer groups based on the shape measurements for the set of top wafers and the shape measurements for the set of bottom wafers;

determine top wafer pairs from selected top wafer groups to establish a set of top wafer pairs;

sort the set of top wafer pairs into top wafer pair groups;

associate each top wafer pair group with a corresponding reference recipe, wherein each top wafer pair group is associated with a bottom wafer pair group in a pre-established manner; and direct a bonder to bond the wafer pairs in a selected wafer pair group according to a corresponding reference recipe associated with the selected wafer pair group.

26. A method comprising:

receiving shape measurements for a set of top wafers from a wafer shape sub-system;

receiving shape measurements for a set of bottom wafers from the wafer shape sub-system;

sorting the set of top wafers and the bottom wafers into wafer groups based on the shape measurements for the set of top wafers and the shape measurements for the set of bottom wafers;

determining wafer pairs from selected wafer groups to establish a set of wafer pairs and calculate a bow difference for each wafer pair of the set of wafer pairs;

sorting the set of wafer pairs into wafer pair groups based on intervals of the bow difference;

associating each wafer pair group with a corresponding reference recipe; and directing a bonder to bond the wafer pairs in a selected wafer pair group according to a corresponding reference recipe associated with the selected wafer pair group.

27. A method comprising:

receiving shape measurements for a set of top wafers from a wafer shape sub-system;

receiving shape measurements for a set of bottom wafers from the wafer shape sub-system;

sorting the set of top wafers and the bottom wafers into wafer groups based on the shape measurements for the set of top wafers and the shape measurements for the set of bottom wafers;

determining top wafer pairs from selected top wafer groups to establish a set of top wafer pairs;

sorting the set of top wafer pairs into top wafer pair groups;

associating each top wafer pair group with a corresponding reference recipe, wherein each top wafer pair group is associated with a bottom wafer pair group in a pre-established manner; and directing a bonder to bond the wafer pairs in a selected wafer pair group according to a corresponding reference recipe associated with the selected wafer pair group.

* * * * *